(12) United States Patent
Argyres

(10) Patent No.: US 8,675,798 B1
(45) Date of Patent: Mar. 18, 2014

(54) SYSTEMS, CIRCUITS, AND METHODS FOR PHASE INVERSION

(75) Inventor: Dimitri Argyres, San Jose, CA (US)

(73) Assignee: NetLogic Microsystems, Inc., Irvine, CA (US)

(*) Notice: Subject to any disclaimer, the term of this patent is extended or adjusted under 35 U.S.C. 154(b) by 433 days.

(21) Appl. No.: 12/978,045

(22) Filed: Dec. 23, 2010

(51) Int. Cl.
*H04L 7/02* (2006.01)

(52) U.S. Cl.
USPC ............................ 375/359; 375/256; 375/253

(58) Field of Classification Search
USPC .......................................... 375/354–376, 256
See application file for complete search history.

(56) References Cited

U.S. PATENT DOCUMENTS

| | | | | |
|---|---|---|---|---|
| 6,941,484 B2 * | 9/2005 | To et al. | ......................... | 713/500 |
| 2010/0299644 A1 * | 11/2010 | Kawai | .............................. | 716/6 |

\* cited by examiner

*Primary Examiner* — Sam K Ahn
*Assistant Examiner* — Janice Tieu
(74) *Attorney, Agent, or Firm* — Sterne, Kessler, Goldstein & Fox P.L.L.C.

(57) ABSTRACT

Systems, methods, and circuits provide phase inversion of a clock signal. A first clock signal is received. A phase inversion signal indicates the existence of a 180 degree phase difference between the first clock signal and a second clock signal. As a result of the phase inversion signal indicating the 180 degree phase difference, the system, methods and circuits adapt the first clock signal by extending the first clock signal by a phase such that the first clock signal's rising edges and falling edges align with the second clock signal's rising edges and falling edges. As a result, the 180 degree phase difference between the clock signals is eliminated.

20 Claims, 11 Drawing Sheets

SYSTEMS, CIRCUITS, AND METHODS FOR PHASE INVERSION

BACKGROUND OF THE INVENTION

1. Field of the Invention

The present invention is related to the field of data communications, and more specifically towards systems, circuits, and methods for phase inversion of a clock signal.

2. Art Background

Electronic circuits utilize serial data transmission to transmit data among one or more circuits. In general, serial data transmission involves transmitting bits in a single bit stream at a predetermined data rate. The data rate is expressed as the number of bits transmitted per second ("bps"). Typically, to transfer data between circuits, the sending circuit employs a transmitter that modulates and sends data using a local clock. The local clock provides the timing for the bit rate. The receiving circuit employs a receiver to recover the data, and in some cases, the clock. The receiver circuit recovers the serial bit stream of data by sampling the bit stream at the specified data rate.

Techniques have been developed in an attempt to optimize the timing performance of circuits receiving data and clock signals. For example, flip-flops or memory components of a receiving circuit may be constrained by setup time and hold time violations. Setup time is the minimum amount of time that the data signal should be held steady before a clock event such that the data is reliably sampled by the clock. Hold time is the minimum amount of time that the data signal should be held steady after the clock event such that the data is reliably sampled. Both setup time and hold time are important design considerations with respect to synchronous circuits such as flip flops that receive a clock signal. A setup time violation or a hold time violation may result in unstable or unreliable data.

Techniques have been developed to adjust the data signal in order to optimize the timing performance parameters of circuits. For example, buffers or delays may be inserted to adjust the delay of data signals to address setup time violations and/or hold time violations. However, it is also advantageous to be able to adjust or adapt the clock signal in order to optimize the timing performance of a circuit. For example, in some systems, the clock signal may be subject to clock skew, or timing skew, where a clock signal arrives at different components in a synchronous circuit at different times. This may be caused by differences in wire interconnect length, temperature variations, capacitive coupling, and material imperfections or defects.

Accordingly, it is highly desirable to develop systems, circuits and methods for adjusting a clock signal. For example, it is highly desirable to address phase differences between clock signals in order to improve the timing performance of a circuit.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

The systems, methods, and circuits disclosed herein provide phase inversion of a clock signal. Specifically, the systems, methods, and circuits extend a clock signal by a phase when there is a 180 degree phase difference between the clock signal and a second reference clock signal.

Figure 1:
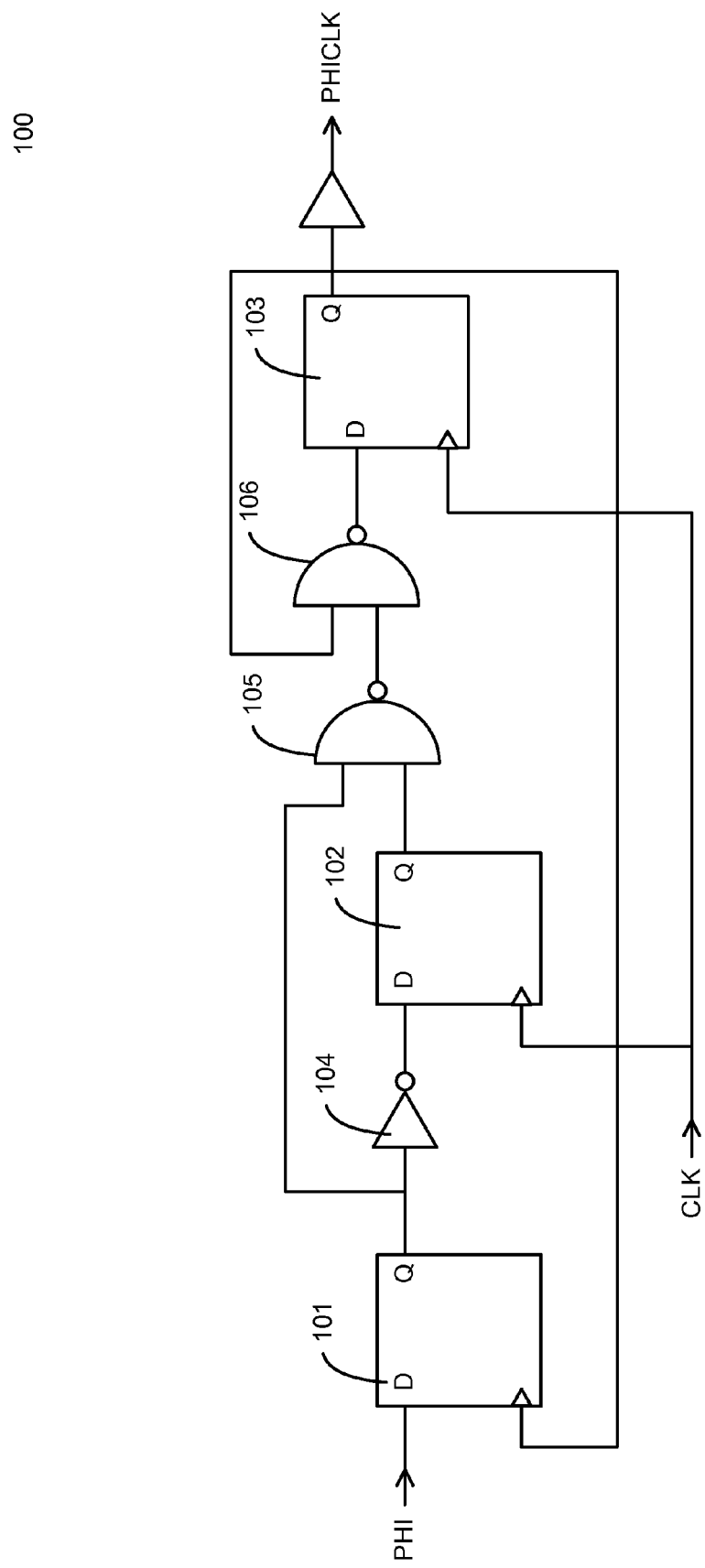
FIG. 1 illustrates a prior art version of a phase inversion circuit that requires a 2× running clock signal.

FIG. 1 illustrates a conventional phase inversion circuit 100. In general, the conventional phase inversion circuit 100 receives a clock signal (CLK) and a PHI signal, which indicates when a phase inversion needs to be performed on the CLK signal. The output of the conventional phase inversion circuit 100 is a PHICLK signal, which is the CLK signal after undergoing the phase inversion method.

As seen in FIG. 1, the conventional phase inversion circuit 100 comprises three flip flops 101, 102, and 103, inverter 104, and logical NAND gates 105 and 106. Flip flop 101 receives a clock signal (CLK) at its clock input and a PHI signal at its data input. The output of the flip flop 101 is connected to the inverter 104 which is subsequently connected to the data input of flip flop 102. The CLK signal is connected to the clock input of flip flop 102. The output of flip flop 102 is connected to NAND gate 105. The second input of the NAND gate 105 is comprised of the output of flip flop 101. The output of the NAND gate 105 is connected to an input of NAND gate 106. The second input of NAND gate 106 is the clock input signal of flip flop 101. The output of NAND gate 106 is connected to the data input of flip flop 103. Similar to flip flop 102, the clock input of flip flop 103 is the CLK signal. The output of flip flop 103 is the PHICLK signal.

As illustrated in FIG. 1, the conventional phase inversion circuit 100 receives a PHI signal and a clock signal (CLK) and outputs a PHICLK signal. The PHI signal indicates when a phase inversion operation needs to be performed on the CLK signal. As such, in the conventional phase circuit 100, when the PHI signal goes high to a logical '1', a phase inversion is performed on the CLK signal. The output of the conventional phase inversion circuit 100 is the PHICLK signal, which is the CLK signal with a phase inversion. Although the conventional phase inversion circuit 100 may perform phase inversion of a clock signal, the conventional circuit contains inherent disadvantages. For example, the conventional phase inversion circuit 100 requires a 2× running CLK signal because the PHICLK signal is one half the frequency of the CLK signal. This is due to the clocking implementation of flip flops 102 and 103. As such, the conventional circuit 100 requires a CLK signal to operate at a higher frequency than may be necessary.

Figure 2:
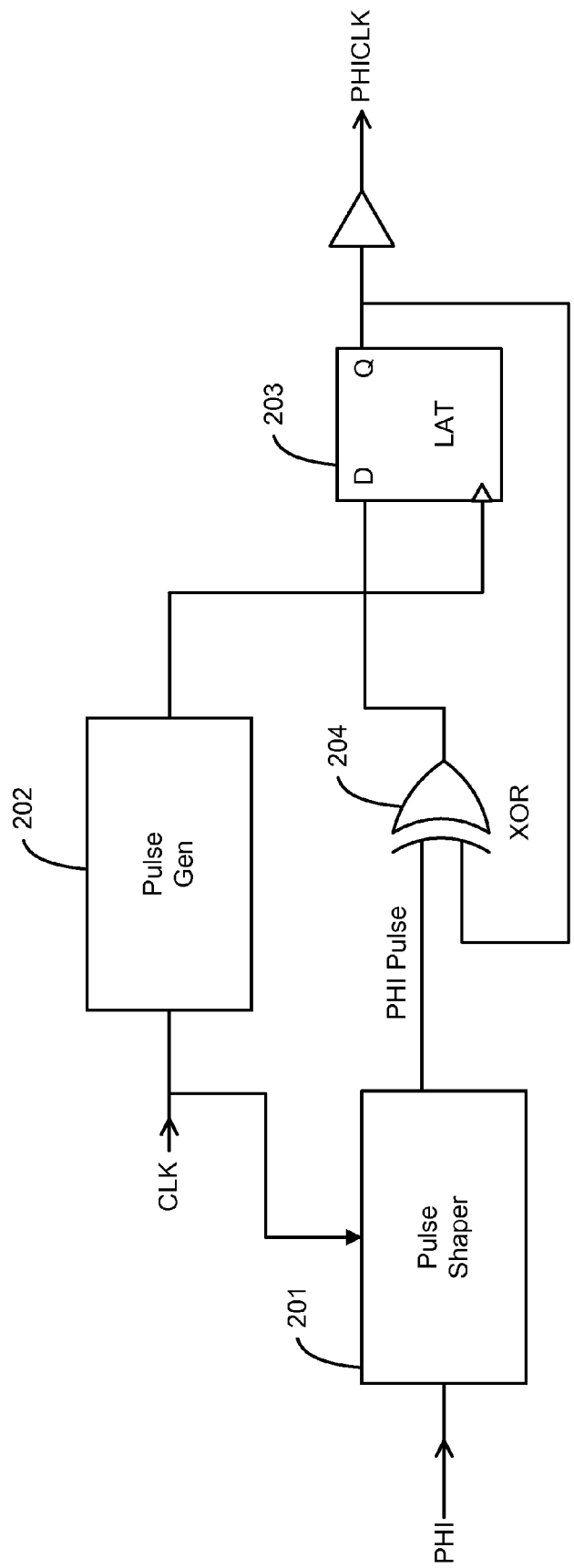
FIG. 2 illustrates an example of a phase inversion circuit in accordance with some embodiments.

FIG. 2 illustrates an example phase inversion circuit or system in accordance with some embodiments of the invention. In general, the phase inversion circuit 200 receives a clock input signal CLK and an input PHI and outputs a signal PHICLK. The PHI input may indicate that there is a phase difference between the clock input to the phase inversion circuit 200 and a second clock signal (not illustrated). In some embodiments, the PHI signal may indicate that there is a 180 degree phase difference between the clock input to the phase inversion circuit 200 and the second clock signal. In some embodiments, the PHI signal may comprise an active-high signal. For example, when a 180 degree phase difference between the clock input signal and the second clock signal is detected, the PHI signal may change to a logical '1' state from a logical '0' state. In some embodiments, the PHI signal may comprise an active-low signal. For example, when a 180 degree phase difference is detected between the clock input signal and the second clock signal, the PHI signal may change to a logical '0' state from a logical '1' state.

As such, the PHI signal may indicate when a phase inversion may be performed on the clock input signal of the phase inversion circuit 200. The output signal (PHICLK) of the phase inversion circuit 200 may comprise the CLK signal after it has been adjusted by the phase inversion process.

As illustrated in FIG. 2, a pulse generator 202 receives a clock signal. In some embodiments, the pulse generator 202 is a double edge-triggered pulse generator that generates a pulse on the rising and falling edge of the input clock signal. The output pulse of the pulse generator 202 is connected to a clock enable of a latch 203. As such, in some embodiments, the output of the pulse generator provides a pulse signal that controls the operation of the latch 203. Thus, in some embodiments, the combination of the pulse generator 202 and the latch 203 may approximate a rising and falling edge triggered D flip flop, as discussed in more detail below. The output of the latch 203 is the signal PHICLK, which is the clock signal CLK after being adjusted by the phase inversion operation. A pulse shaper 201 receives a PHI signal that may indicate that there is a 180 degree phase difference between the input clock signal CLK and a second clock signal. The pulse shaper 201 also receives the input clock signal CLK and generates a PHI Pulse signal. An XOR gate 204 receives the PHI Pulse signal and the PHICLK output signal and performs an XOR logical operation on the inputs. The output of the XOR gate 204 is connected to the data input of latch 203.

The phase of the clock input of the phase inversion circuit 200 may be compared against a second clock signal. In some embodiments, the second clock signal may comprise a separate clock signal from the clock input of the phase inversion circuit 200. For example, the PHI signal may indicate when there is a 180 degree phase difference between the clock input signal of the phase inversion circuit 200 and a separate clock signal generated from a separate source than the clock input of the phase inversion circuit 200. In some embodiments, the second clock signal may comprise the same clock signal as the clock input of the phase inversion circuit 200, but as received by other logic or hardware components. For example, the PHI signal may indicate that there is a 180 degree phase difference between a clock signal as received by the phase inversion circuit 200 and other memory components that receive the clock signal.

In operation, some embodiments of the phase inversion circuit 200 of FIG. 2 perform a phase inversion of an input clock signal CLK when the CLK signal is at a 180 degree phase difference from a second reference clock signal. The PHI signal indicates whether there is a 180 degree phase difference between the CLK signal and the second reference clock signal. The CLK signal is received by a pulse shaper 201. In some embodiments, the pulse shaper 201 generates a ½ cycle PHI Pulse signal in response to the rising edge of the CLK signal and the PHI signal indicating that a phase inversion needs to be performed due to the CLK signal and the second reference clock signal being at a 180 degree phase difference. The pulse generator 202 receives the CLK signal and generates a pulse signal in response to the rising and falling edges of the CLK signal. In some embodiments, the width of the pulse signal is narrow such that the combination of the pulse generator 202 generating a pulse signal with a narrow width with the latch 203 results in a semi-transparent latch. The output of the latch 203 is PHICLK, which is the phase inverted CLK signal. As such, the phase inversion circuit 200 performs a phase inversion of the CLK signal as indicated by the PHI signal. The XOR gate 204 outputs a logical '1' when one of the PHI Pulse signal and the PHICLK signal is a logical '1' or a logical '0' and outputs a logical '0' when both the PHI Pulse signal and the PHICLK signal are a logical '0' or a logical '1'.

In some embodiments, the phase inversion circuit 200 may be capable of outputting the PHICLK at the same frequency as the CLK input signal. Further details on the architecture, design, and operation of the above referenced components are described below.

Figure 3:
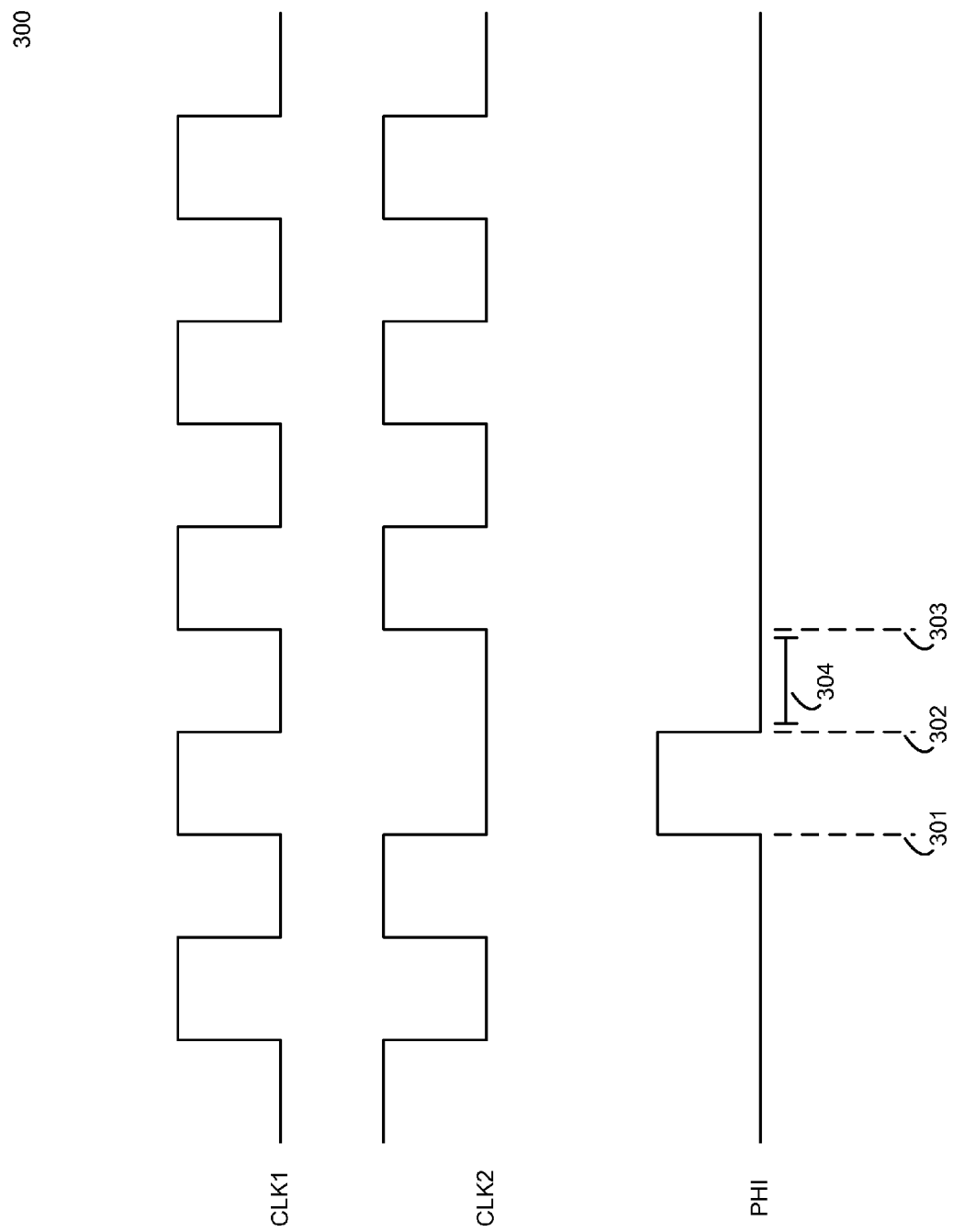
FIG. 3 illustrates a timing diagram of an example of a phase inversion circuit in accordance with some embodiments of the invention.

FIG. 3 is an example timing diagram 300 of an example phase inversion circuit 200. For purposes of illustration, CLK1 may comprise a reference clock signal and CLK2 may comprise the input CLK signal to the phase inversion circuit 200. At point 301, the CLK1 signal is rising and the CLK2 signal is falling. As such, the signals CLK1 and CLK2 are at a 180 degree phase difference at point 301. In some embodiments, the PHI signal will rise when there is a 180 degree phase difference between CLK1 and CLK2. As a result, the PHI signal rises at point 301 to indicate that there is a 180 degree phase difference between CLK1 and CLK2 and that a phase inversion will need to be performed on CLK2 to correct the phase difference between CLK1 and CLK2. At point 302, the CLK1 signal continues as expected. However, at point 302, CLK2 remains at a lower state as it was at the previous point 301. As a result, CLK2's lower state is effectively extended a phase 304. CLK2 continues at point 303 such that CLK2 rises at point 303 to coincide with CLK1 rising at point 303. Thus, CLK2 has been adjusted to align its rising edge with the rising edge of CLK1 at point 303. As seen from the timing diagram 300, both signals CLK1 and CLK2 continue as expected after point 303. As a result, there is no longer a phase difference between CLK1 and CLK2.

In some embodiments, the PHI signal may fall to a logical '0' state from a logical '1' state when there is a 180 degree phase difference between CLK1 and CLK2. In the same or alternative embodiments, the phase inversion circuit 200 may extend the higher state of the signal CLK2 a phase 304. For example, at a certain point in time, CLK1 may comprise a falling edge while at the same point in time CLK2 may comprise a rising edge. As such, there is a 180 degree phase difference between CLK1 and CLK2. The PHI signal may indicate that such a phase difference currently exists between the two signals. In response to the PHI signal, the upper state or the logical '1' state of CLK2 may be extended a phase such that the falling edge of CLK2 now aligns with the falling edge of CLK1. As a result, there would be no phase difference between CLK1 and CLK2. In some embodiments, the phase inversion circuit 200 may be capable of extending either the upper state (logical '1' state) or the lower state (logical '0' state) of the CLK2 signal in order to eliminate the 180 degree phase difference between CLK1 and CLK2.

Figure 4:
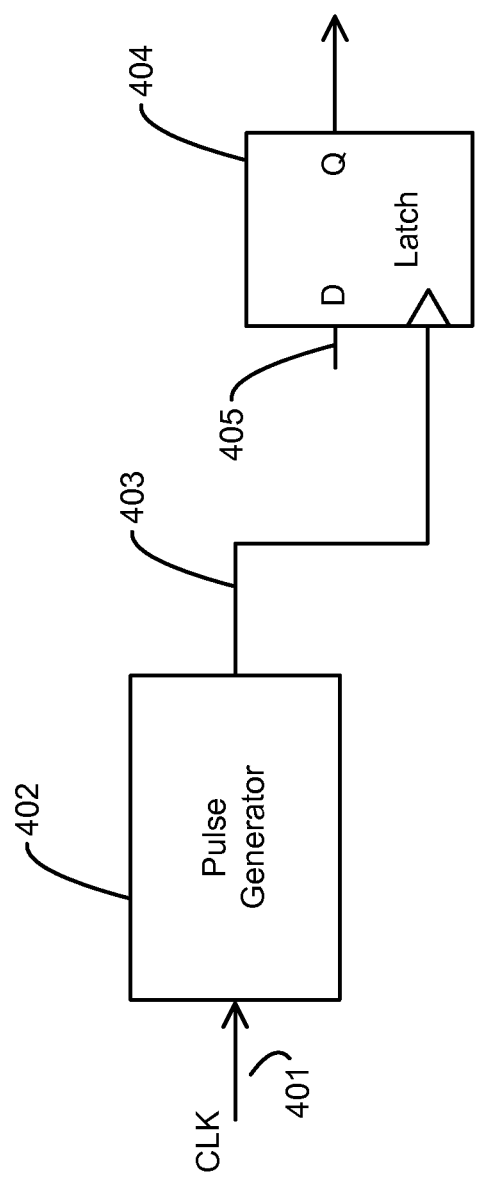
FIG. 4 illustrates an example embodiment of a semi-transparent latch configuration used in an example embodiment of a phase inversion circuit.

FIG. 4 illustrates an example embodiment of a transparent latch system 400. In general, the transparent latch system 400 receives a clock signal and data from a logical gate and outputs the PHICLK signal. In some embodiments, the transparent latch system 400 comprises a pulse generator 402 and a latch 404.

As seen in FIG. 4, the pulse generator 402 receives a clock signal 401. The output pulse 403 from the pulse generator 402 is received at the clock enable of the latch 404. A data input 405 is also provided to the latch 404 and the latch 404 outputs a signal based on the data input 405.

In operation, the pulse generator 402 generates a narrow pulse in response to the clock signal. The pulse generator 402 may comprise a double edge triggered pulse generator that generates a narrow pulse on the rising or falling edge of the clock signal 401. As such, the pulse generator may generate a narrow pulse as the received clock signal rises and falls. In some embodiments, the latch 404 may output the data input 405 as sampled when the clock enable of the latch 404 is at an upper state or logical '1'. In some embodiments, the clock enable of the latch 404 is coupled to the output pulse 403 of the pulse generator 402. As such, the clock enable of the latch 404 may receive two narrow pulses for every clock cycle. Since the pulse generator 402 may generate a narrow output pulse 403, the combination of the latch 404 with the narrow output pulse 403 approximates a rising and falling edge triggered D flip flop. This may be advantageous in some embodiments as it may result in the utilization of less logic and faster operation as opposed to the implementation of a rising and falling edge triggered D flip flop.

Figure 5:
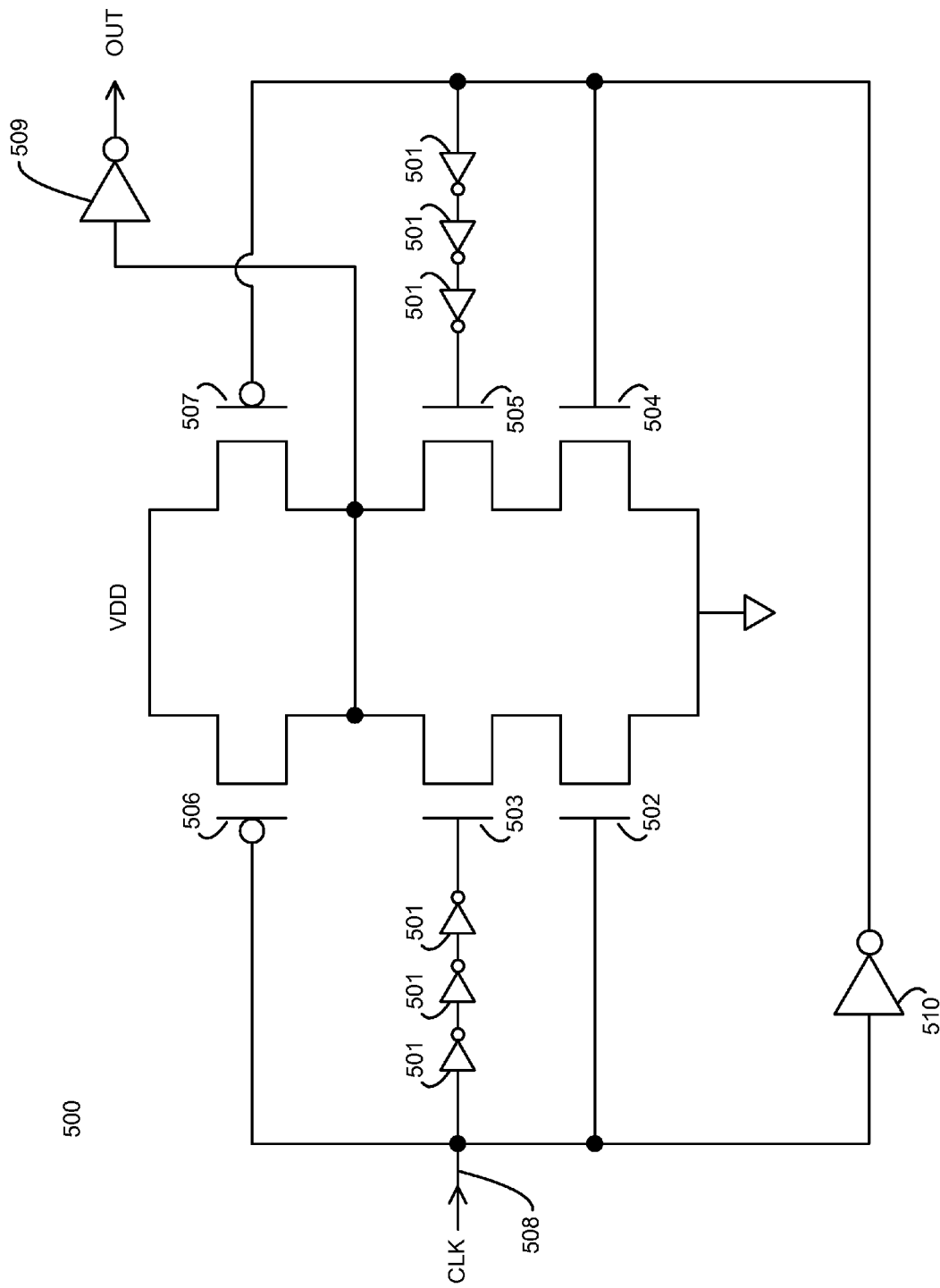
FIG. 5 illustrates an example embodiment of a pulse generator used in an example embodiment of a phase inversion circuit.

FIG. 5 is an example embodiment of an example double edge triggered pulse generator 500. In general, the pulse generator 500 receives a clock signal and outputs a pulse on the rising and falling edges of the clock signal.

As seen in FIG. 5, the pulse generator 500 receives a clock signal 508 and outputs a pulse at output 509 at the falling and rising edges of the clock signal 508. The pulse generator 500 may comprise CMOS logic. Specifically, the pulse generator 500 may comprise PMOS transistors 506 and 507 and NMOS transistors 502, 503, 504, and 505. The pulse generator 500 may also comprise a series of inverters 501. The pulse width of the output pulse 509 is determined by the series of inverters 501 on each side of the pulse generator 500 and the capacitance between the inverters 501. As such, any number or combination of inverters 501 may be placed on either side of the pulse generator as seen in FIG. 5 in order to generate a desired pulse width for pulse output 509. In some embodiments, the inverters 501 are placed such that the pulse generator 500 generates a narrow pulse width such that the narrow pulse width in combination with the latch 404 may approximate a rising and falling edge triggered D flip flop.

Figure 6:
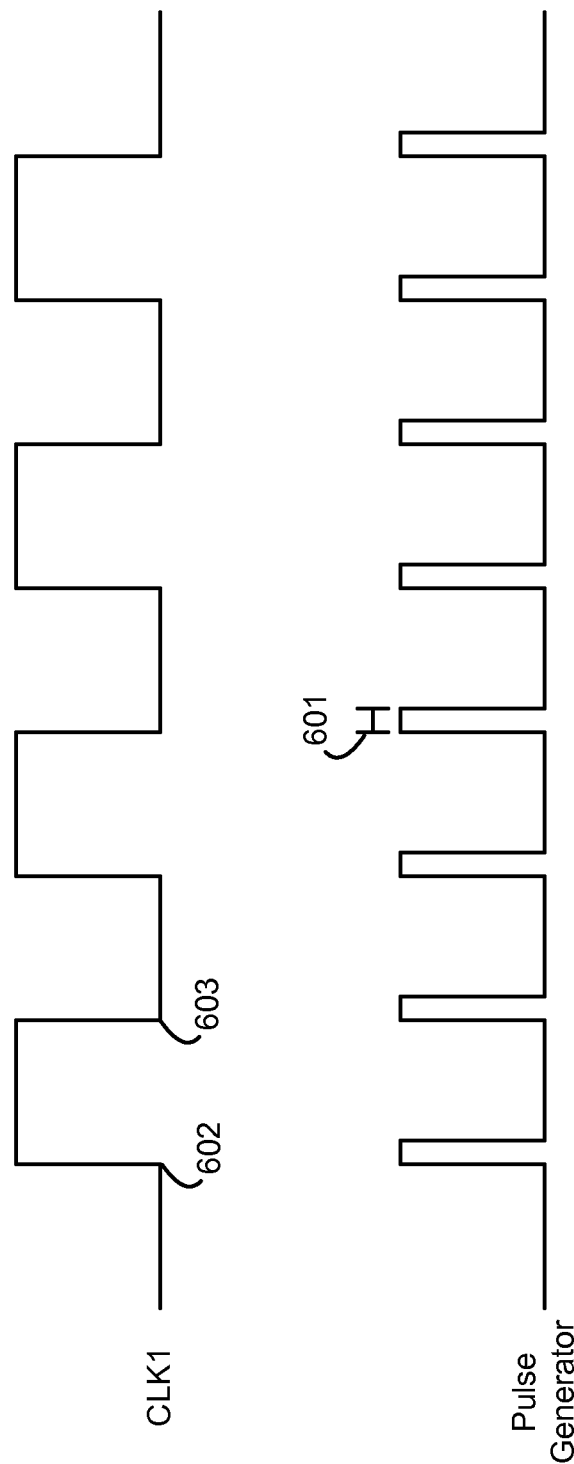
FIG. 6 illustrates a timing diagram of an example embodiment of a pulse generator used in some embodiments of a phase inversion circuit.

FIG. 6 is a timing diagram 600 of an example embodiment of a double edge triggered pulse generator 500 that may be used in some embodiments of a phase inversion circuit 200.

As illustrated, the output pulse is generated at the rising and falling edges of the clock signal. An output pulse is generated at point 602 at the rising edge when the clock signal rises to a logical '1' state and an output pulse is generated at point 603 at the falling edge when the clock signal falls to a logical '0' state. In some embodiments, the output pulse width 601 is narrow such that the combination of the narrow output pulse width 601 with a latch approximates a rising and falling edge triggered D flip flop.

Figure 7:
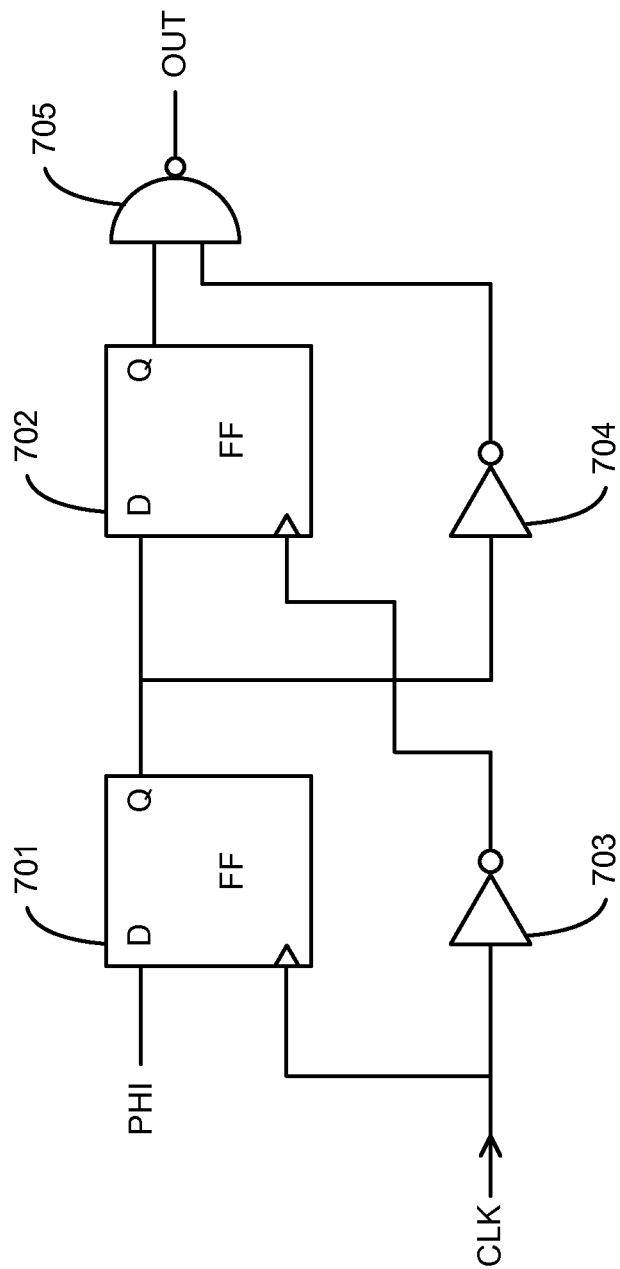
FIG. 7 illustrates an example embodiment of a pulse shaper used in an example embodiment of a phase inversion circuit.

FIG. 7 illustrates an example embodiment of a pulse shaper 700 that may be used in some embodiments of the phase inversion circuit 200. In general, the pulse shaper 700 generates a one half cycle pulse on the rising edge of the PHI signal in embodiments where the PHI signal rises to indicate that there is a 180 degree phase difference between two clock signals. In other embodiments, the PHI signal may fall to indicate the 180 degree phase difference between the clock signals and, as such, the pulse shaper 700 may generate a one half cycle pulse on the falling edge of the PHI signal.

As seen in FIG. 7, the pulse shaper 700 may comprise D flip flops 701 and 702, inverters 703 and 704, and NAND logic gate 705. Flip flop 701 receives the clock signal CLK and the PHI signal as inputs. The output of flip flop 701 is coupled to the data input of flip flop 702. The clock input of flip flop 702 is coupled to the inverter 703, which is coupled to the CLK signal. As such, the flip flop 702 is clocked by the inverted CLK signal. The output of flip flop 702 is connected to NAND gate 705. The second input of the NAND gate 705 is coupled to inverter 704 which receives the output of flip flop 701. As such, the NAND gate performs a NAND logical operation on the output of flip flop 702 and the inverted output of flip flop 701. Thus, the NAND gate 705 may output a logical '0' if both the output of flip flop 702 and the inverted output of flip flop 701 are a logical '1'. Otherwise, the NAND gate 705 will output a logical '1'.

Although a NAND gate 705 is shown in FIG. 7, other logic gates and configurations may be implemented so as to create a one half cycle pulse on the rising or falling edge of the PHI signal. For example, some embodiments may utilize a NOR gate instead of the NAND gate 705 and implement logic necessary to accomplish the functionality of pulse shaper 700.

Figure 8:
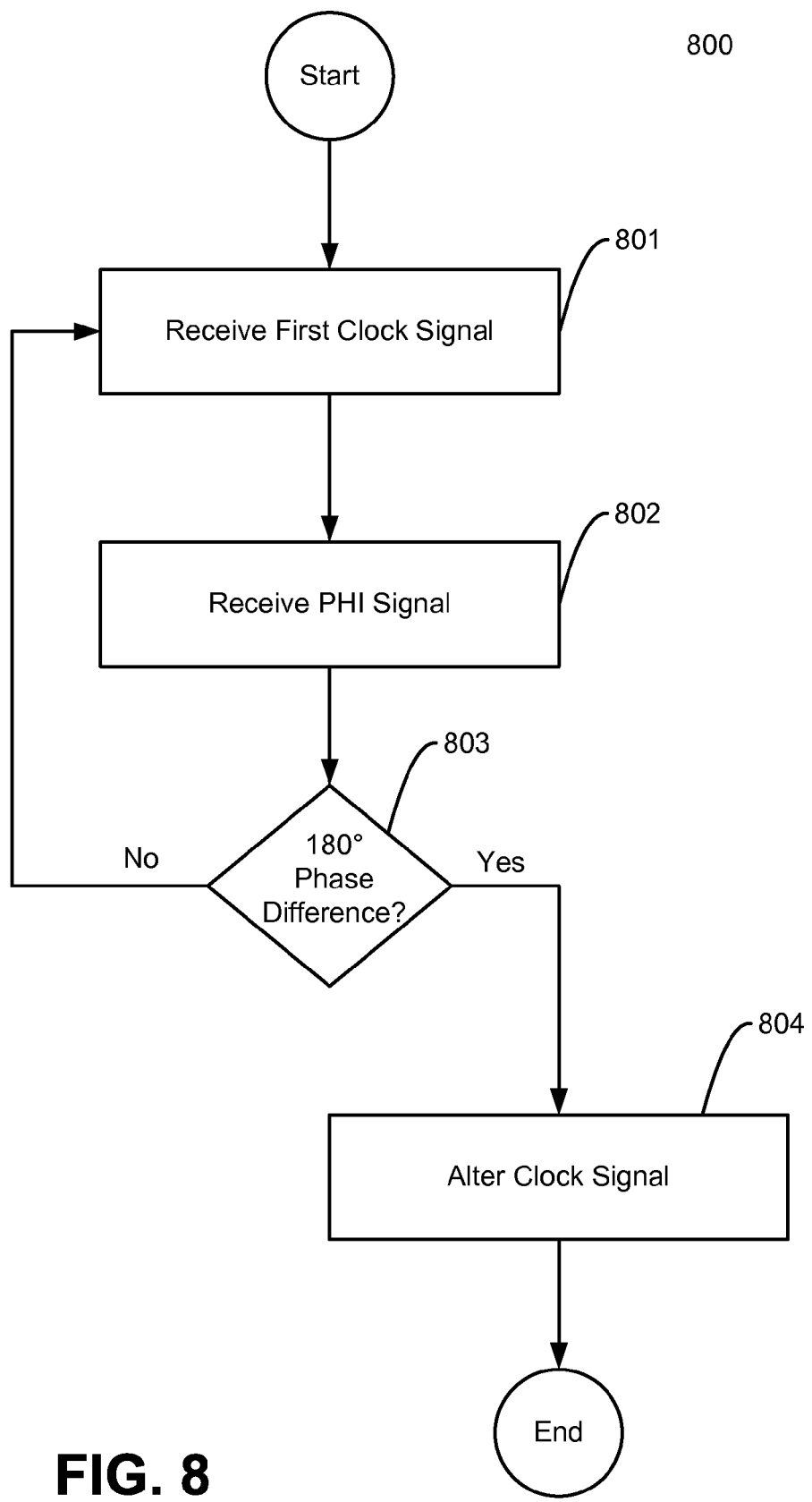
FIG. 8 is a flow diagram illustrating an example embodiment of a phase inversion method.

FIG. 8 is a flow diagram 800 illustrating an example embodiment of a phase inversion method for a clock signal. At block 801, the first clock signal is received. In some embodiments, the first clock signal is the clock signal that will be adjusted by the phase inversion circuit 200. At block 802, a PHI signal is received. In some embodiments, the PHI signal indicates that there is a 180 degree phase difference between the first clock signal and a second clock signal. For example, the PHI signal may go high whenever there is a 180 degree phase difference between the first clock signal and the second clock signal. In some embodiments, the method 800 may receive both the first clock signal and the second clock signal and then determine from the first clock signal and the second clock signal whether there is a 180 degree phase difference between the first clock signal and second clock signal.

As such, in some embodiments, the method 800 receives the first clock signal and second clock signal and generates a PHI signal. At block 803, the method 800 determines whether there is a 180 degree phase shift between the first clock signal and the second clock signal. In some embodiments, the PHI signal indicates whether there is a 180 degree phase shift. In some embodiments, the previous steps at blocks 801 and 802 may be repeated if there is not a 180 degree phase difference between the first clock signal and the second clock signal. For example, the method 800 may continuously receive the first clock signal at block 801 and the PHI signal at block 802 until a 180 degree phase difference is found, as indicated by the PHI signal, between the first clock signal and the second clock signal. If there is a 180 degree phase difference between the first clock signal and the second clock signal then, at block 804, the method 800 may adjust the first clock signal. As discussed above, the high state or low state of the first clock signal may be extended a phase such that the falling edge or the rising edge of the first clock signal now aligns with the falling edge or the rising edge of the second clock signal. As a result, there is no phase difference between the first clock signal and the second clock signal. In some embodiments, the method 800 may repeat the previous steps starting at block 801 after the first clock signal has been adjusted to align with the second clock signal.

Figure 9:
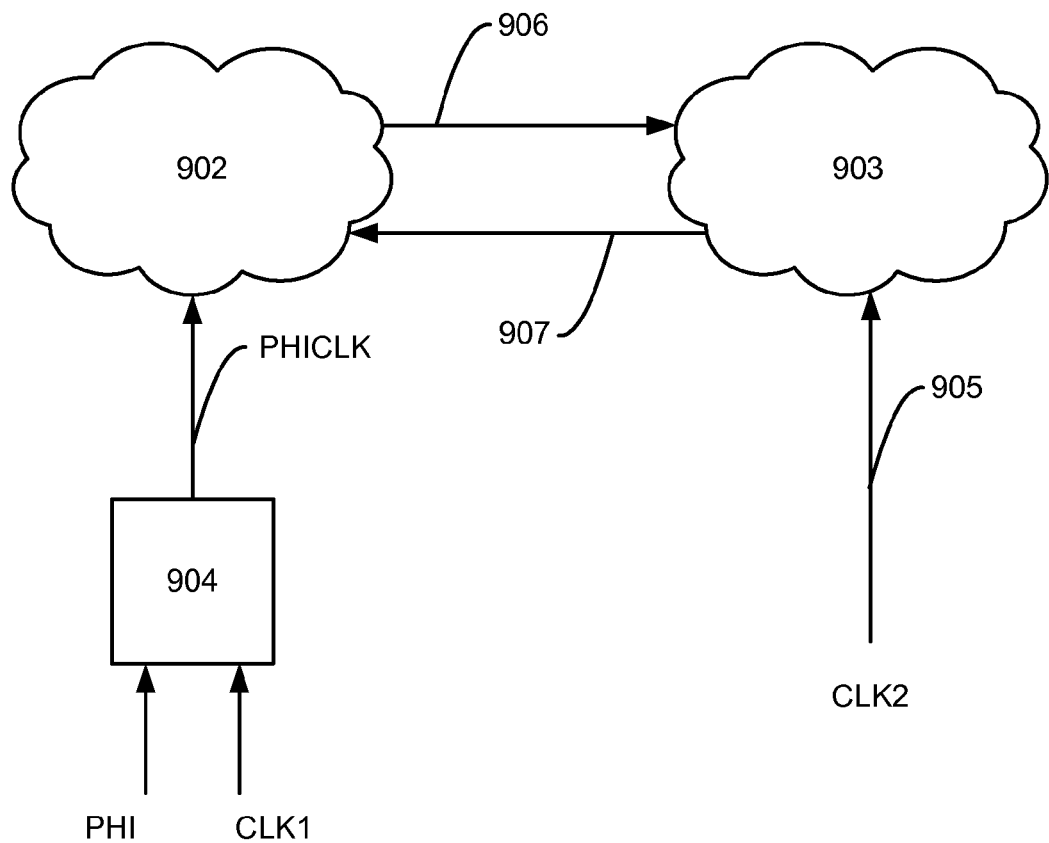
FIG. 9 illustrates an example embodiment of a system using a phase inversion circuit in accordance with some embodiments of the present invention.

FIG. 9 illustrates an example embodiment of a system using a phase inversion circuit 200. In general, the system 900 comprises logic groups 902 and 903. In some embodiments, data may be transmitted and received between logic group 902 and logic group 903. For example, data 906 may be transmitted from logic group 902 to logic group 903. Moreover, data 907 may be transmitted from logic group 903 to logic group 902. As such, in some embodiments, it may be desirable to ensure that each logic group's respective clock signals are aligned with each other in order to minimize any possible timing violations or errors.

As seen in FIG. 9, each of the logic groups 902 and 903 receives a clock signal. For example, logic group 902 receives the clock signal PHICLK and logic group 903 receives the clock signal CLK2. In some embodiments, the CLK1 and CLK2 signals may be derived from separate sources. In other embodiments, the CLK1 and CLK2 signals may be derived from the same clock source, but the rising or falling edges of the CLK1 and CLK2 signals may not be aligned. In some embodiments, the logic group 902 and the logic group 903 comprise any number of logic gates, flip flops, latches, memory components, and any other hardware components. In some embodiments, the flip flops, latches, other memory components, and other hardware components may use the respective clock signal of the logic group 902 or logic group 903. In some embodiments, a phase module (not shown) detects whether there is a 180 degree phase difference between CLK1 and CLK2. The phase module may generate a PHI signal that may indicate whether a 180 degree phase shift between CLK1 and CLK2 exists. Both the CLK1 signal and the PHI signal are received by module 904, which in some embodiments may comprise the phase inversion circuit 200 and/or phase inversion method 800 as described above. As a result, the module 904 comprising the phase inversion circuit 200 receives CLK1 and PHI and may adjust the CLK1 signal if it is at a 180 degree phase difference with CLK2. Thus, the logic gates, flip flops, latches, other memory components, and any other hardware component within logic group 902 will receive the adjusted CLK1 signal such that there is no phase difference between the adjusted CLK1 signal and the CLK2 signal. Thus, in some embodiments, the adjusted CLK1 signal ensures that there is not a 180 degree phase difference in the clocking schemes between logic group 902 and logic group 903.

Application Embodiments

Figure 10:
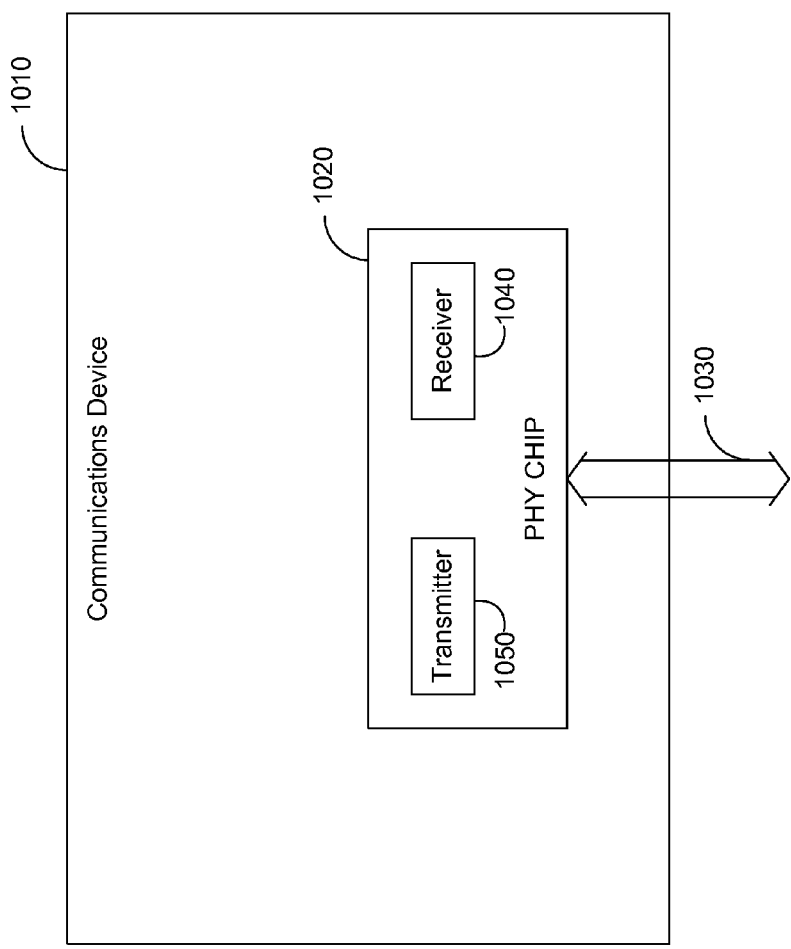
FIG. 10 is a block diagram that illustrates one embodiment for implementing the phase inversion systems, circuits, and methods on a single integrated circuit ("IC").

The systems, circuits, and methods disclosed herein may be implemented on one or more integrated circuits. FIG. 10 is a block diagram illustrating one embodiment for implementing the systems, circuits, and methods of the present invention on a single integrated circuit. In some embodiments, a physical layer ("PHY Layer") integrated circuit 1020 is used to define electrical and physical specifications for a communications device 1010. As such, the PHY Layer integrated circuit 1020 may define the relationship between the communications device 1010 and a transmission medium 1030. The PHY Layer integrated circuit 1020 may consist of the basic hardware transmission technologies of a network and provide related functions and services. For example, the PHY Layer integrated circuit may, but is not limited to, establish and terminate a connection to a transmission medium 1030, modulate or convert between the representation of digital data used in the communications device 1010 and the corresponding signals transmitted over the transmission medium 1030, providing a standardized interface to the transmission medium 1030, line coding, bit synchronization, circuit switching, multiplexing, forward error correction, and/or bit-interleaving.

In some embodiments, the PHY Layer integrated circuit 1020 may consist of a transmitter 1050 and a receiver 1040. In general, the transmitter 1050 may modulate and condition data streams for transmission over a transmission medium 1030 and the receiver 1040 may modulate and condition data streams transmitted to the receiver 1040 over a transmission medium 1030. In some embodiments, the transmitter 1050 and/or the receiver 1040 may comprise the systems, methods, and circuits discussed with relation to FIGS. 2, 4, 5, and 7. In the same or alternative embodiments, the transmitter 1050 and/or receiver 1040 may comprise the method discussed with relation to FIG. 8. In some embodiments, the PHY Layer integrated circuit 1020 may operate as a transceiver such that the circuit both transmits data over the transmission medium 1030 and receives data from the transmission medium 1030. However, in some embodiments, each of the receiver 1040 and the transmitter 1050 may be implemented as a single integrated circuit. As such, the PHY Layer integrated circuit 1020 may be implemented in the form of a plurality of integrated circuits. Moreover, the transmitter 1050 and/or the receiver 1040 may each comprise IP blocks for incorporation into one or more integrated circuits. Although the PHY Layer integrated circuit 1020 has been discussed with relation to the transmitter 1050 and receiver 1040, it should be appreciated that the PHY Layer integrated circuit 1020 may comprise other hardware components, logical blocks, or integrated circuits that may implement the systems, methods, and circuits disclosed herein. As such, the PHY Layer integrated circuit 1020 may comprise any combination or number of receivers 1040, transmitters 1050, hardware components, logical blocks, and/or integrated circuits.

The transmission medium 1030 may transmit and receive data to and from the PHY Layer integrated circuit 1020 in order to facilitate data communication over a network. Examples of a transmission medium may comprise, but are not limited to, metallic cables, fiber optic cables, and a wireless network. In some embodiments, if a metallic cable is used as the transmission medium 1030, then the PHY Layer integrated circuit 1020 may convert data transmitted to the transmission medium 1030 into electrical signals. In other embodiments, if a fiber optical cable is used as the transmission medium 1030, then the PHY Layer integrated circuit 1020 may convert data transmitted to the transmission medium 1030 into luminous signals. Similarly, in some embodiments, if a wireless network is used as the transmission medium 1030, then the PHY Layer integrated circuit 1020 may convert data transmitted to the transmission medium 1030 into electromagnetic signals. As such, in some embodiments, the PHY Layer integrated circuit 1020 receives data for transmission to the transmission medium 1030 and converts the data into signals representing binary 0's and 1's. This converted data may then be received by another component comprised within communications device 1010.

The PHY Layer integrated circuit 1020 may be configured to function with relation to a variety of protocols used by the communications device 1010. For example, the PHY Layer Integrated circuit 1020 may be configured to function with regard to an IEEE 802.3 standard such as a 10 Gigabit Ethernet (10 GigE) standard. The PHY Layer integrated circuit 1020 may be configured to function in conjunction with other protocols. Examples of such protocols may comprise, but are not limited to, Synchronous Optical Networking (SONET)/Synchronous Digital Hierarchy (SDH), V.92 for telephone network modems, Infrared Data Association (IrDA) Physical Layer, Universal Serial Bus (USB) Physical Layer, Recommended Standard 232 (RS-232), RS-422, RS-423, RS-449, RS-485, Ethernet Physical Layer (10Base-T, 10BASE2, 100BASE-TX, 10 GigE, etc.), 802.11 Wi-Fi Physical Layers, Digital Subscriber Line (DSL), Integrated Services Digital Network (ISDN), Optical Transport Network (OTN), Bluetooth Physical Layer, and Firewire.

In some embodiments, the PHY Layer integrated circuit 1020 may receive data or a request from another hardware component or software module within the communications device 1010. A software module or hardware component operating at a Data Link Layer may transmit data and/or requests to the PHY Layer integrated circuit 1020. For example, the PHY Layer integrated circuit 1020 may translate logical communication requests from the software module or component operating at a Data Link Layer into hardware specific operations that may affect the transmission or reception of electronic signals over the transmission medium 1030. As such, in some embodiments, the PHY Layer integrated circuit 1020 may communicate and interact with software modules or another component operating at another portion or layer of a communications system. For example, the PHY Layer integrated circuit 1020 may communicate with another software module or another hardware component operating within the Physical Layer, Data Link Layer, Network Layer, Transport Layer, Session Layer, Presentation Layer, and/or Application Layer. As such, the PHY Layer integrated circuit 1020 may be comprised within a communications device 1010 that may also comprise other software modules or hardware components that directly or indirectly communicate with the PHY Layer integrated circuit 1020.

As a result, in some embodiments, the PHY Layer integrated circuit 1020 may receive data from a transmission medium 1030. The PHY Layer integrated circuit 1020 may convert the data and the resulting converted data may be used by other software modules or hardware components within the communications device 1010 or in a separate communications device.

The communications device 1010 may comprise a hardware component configured to operate within a network environment. Examples of a communications device 1010 that may comprise the PHY Layer integrated circuit 1020 are, but are not limited to, a network adapter, network interface controller (NIC), repeater, network hub, switch, router, modem, USB controller, Serial ATA controller, SDRAM chip interface, flash memory chip interface, transceiver, or a host bus adapter (HBA). The communications device 1010 may comprise, but is not limited to, components of an optical fiber network, such as those components mentioned earlier or a fiber media converter, an add-drop multiplexer (ADM), reconfigurable optical add-drop multiplexers (ROADMs), a regenerator, or a digital cross connect system (DCS). As such, the communications device 1010 may comprise at least one hardware component configured to operate within a network environment.

Figure 11:
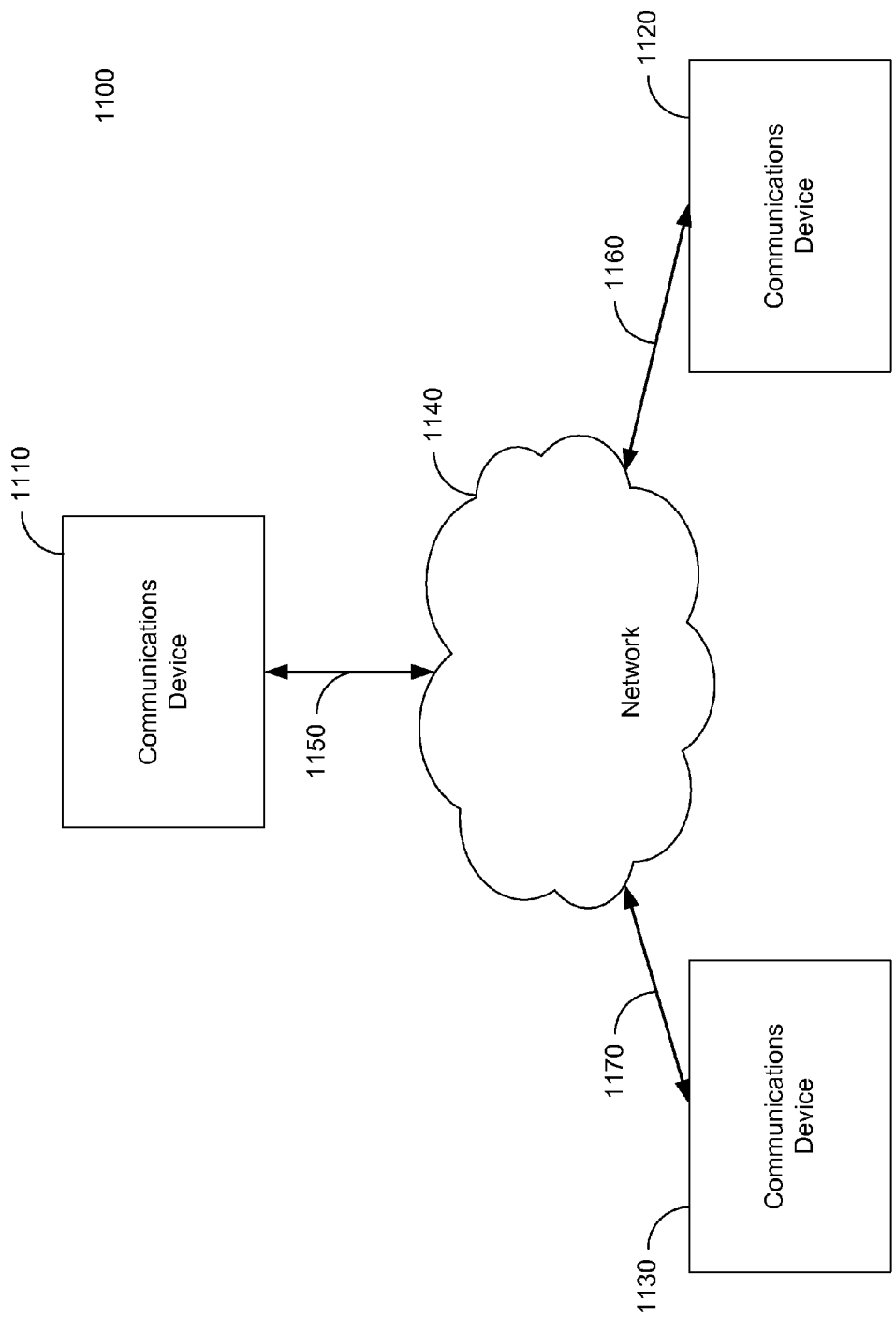
FIG. 11 is a block diagram illustrating one embodiment of a network system that incorporates the phase inversion systems, circuits, and methods of the present invention.

FIG. 11 is a block diagram illustrating an example embodiment of a network system 1100 that may incorporate the systems, circuits, and methods disclosed herein. In some embodiments, one or more communication devices 1110, 1120, and 1130 are coupled to a network 1140 by a transmission medium 1150, 1160, or 1170. In some embodiments, the communication device 1110 may comprise a router coupled to one or more computer devices (not shown) such that the computers are coupled to the network 1140 by means of the router. The router may incorporate one or more PHY Layer integrated circuits 1020. In turn, the PHY Layer integrated circuits may incorporate a receiver and/or a transmitter. In some embodiments, the PHY Layer integrated circuits comprise, at least in part, the various components discussed with relation to FIGS. 2, 4, 5, and 7. In other embodiments, the PHY Layer integrated circuits comprise, at least in part, the method of FIG. 8.

In operation, the router 1120 may use a PHY Layer integrated circuit 1020 to transmit data to communications device 1130. As such, the PHY Layer integrated circuit 1020 may be enabled to transmit data from the communication device 1120 over the transmission medium 1150, through the network 1140, to transmission medium 1160 to communications device 1120. The communications device 1120 may also comprise a PHY Layer integrated circuit 1020 that is configured to receive data over the transmission medium 1160.

Hardware Embodiments

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for phase inversion of a clock signal, comprising:
   generating, using a phase inversion circuit, a narrow width pulse signal at an edge of a received first clock signal;
   generating, using the phase inversion circuit, a half cycle pulse signal based on a received phase inversion signal, the half cycle pulse signal indicating that the first clock signal and a second clock signal are at a 180 degree phase difference; and
   generating, using the phase inversion circuit, a modified clock signal based on the narrow width pulse signal and the half cycle pulse signal, wherein the generating of the modified clock signal includes extending a portion of the first clock signal by a phase so that a rising edge of the modified clock signal is aligned with a rising edge of the second clock signal.

2. The method as set forth in claim 1, further comprising:
   operating the first clock signal and the modified clock signal at an identical frequency.

3. The method as set forth in claim 1, wherein the generating of the modified clock signal comprises generating the modified clock signal from an output of a semi-transparent latch system.

4. The method as set forth in claim 3, comprises:
   generating, using a pulse generator included in the semi-transparent latch system, the narrow width pulse signal based on the first clock signal; and sampling data using a latch included in the semi-transparent latch system.

5. The method as set forth in claim 3,
   generating, using a double edge triggered pulse generator, the narrow width signal pulse signal at a rising edge and a falling edge of the first clock signal.

6. The method as set forth in claim 4 comprising:
   determining a width of the narrow width pulse based on a number of inverters implemented in the pulse generator.

7. The method as set forth in claim 1, wherein the extending of the portion of the first clock signal by the phase comprises extending a lower state of a clock cycle of the first clock signal by the phase to align the rising edge of the modified clock signal with the rising edge of the second clock signal.

8. A system for phase inversion of a clock signal, comprising:
   a phase inversion circuit configured to:
     generate a narrow width pulse signal at an edge of a received first clock signal;
     generate a half cycle pulse signal based on a received phase inversion signal, the half cycle pulse signal indicating that the first clock signal and a second clock signal are at a 180 degree phase difference; and
     generate a modified clock signal based on the narrow width pulse signal and the half cycle pulse signal, wherein the generating of the modified clock signal includes extending a portion of the first clock signal by a phase so that a rising edge of the modified clock signal is aligned with a rising edge of the second clock signal.

9. The system as set forth in claim 8, wherein the first clock signal and the modified clock signal operate at an identical frequency.

10. The system as set forth in claim 8, wherein the the phase inversion circuit comprises a semi-transparent latch system configured to generate the modified clock signal.

11. The system as set forth in claim 10, wherein the semi-transparent latch system comprises:
    the narrow width pulse signal generator configured to generate a pulse in response to the first clock signal; and
    a latch configured to sample data.

12. The system as set forth in claim 11, wherein the pulse generator comprises a double edge triggered pulse generator configured to generate the narrow width pulse signal at a rising edge and a falling edge of the first clock signal.

13. The system as set forth in claim 11, wherein the width of the pulse is determined based on a number of inverters implemented in the pulse generator.

14. The system as set forth in claim 10, wherein the portion of the first clock signal extended by the phase comprises a lower state of a clock cycle of the first clock signal, such that extending the lower state by the phase aligns the rising edge of the modified clock signal with the rising edge of the second clock signal.

15. A circuit for phase inversion of a clock signal, comprising:
    a pulse generator configured to receive a first clock signal and to generate a narrow width pulse signal at an edge of the first clock signal;
    a pulse shaper configured to generate a half cycle pulse signal on an edge of a phase inversion signal, the half cycle pulse signal indicating that the first clock signal and a second clock signal comprise a phase difference;
    a logic gate configured to receive the half cycle pulse signal and to output a data signal; and
    a latch configured to receive the data signal and the narrow width pulse signal and to output a phase adjusted clock signal.

16. The circuit as set forth in claim 15, wherein the phase adjusted clock signal comprises the first clock signal having been adjusted by a phase such that a rising edge of the first clock signal is aligned with a rising edge of the second clock signal.

17. The circuit as set forth in claim 15, wherein the phase difference between the first clock signal and the second clock signal comprises a 180 degree phase difference.

18. The circuit as set forth in claim 15, wherein the phase adjusted clock signal and the first clock signal operate at a same frequency.

19. The circuit as set forth in claim 15, wherein the narrow width pulse signal is received at a clock enable input of the latch, and the combination of the narrow width pulse signal with the latch approximates a functionality of a rising and falling edge triggered D flip flop.

20. The circuit as set forth in claim 15, wherein the pulse generator comprises a double edge triggered pulse generator configured to generate the narrow width pulse signal at a rising edge and a falling edge of the first clock signal.

* * * * *

UNITED STATES PATENT AND TRADEMARK OFFICE
CERTIFICATE OF CORRECTION

PATENT NO.       : 8,675,798 B1  
APPLICATION NO.  : 12/978045  
DATED            : March 18, 2014  
INVENTOR(S)      : Dimitri Argyres Page 1 of 1

It is certified that error appears in the above-identified patent and that said Letters Patent is hereby corrected as shown below:

In the Claims  
Column 11, line 44, replace "comprises" with --comprising--.  
Column 11, line 49, insert --comprising:-- after "claim 3,".  
Column 11, line 51, replace "narrow width signal pulse signal" with --narrow width pulse signal--.  
Column 11, line 54, replace "narrow width pulse based on" with --narrow width pulse signal based on--.  
Column 12, line 13, replace "wherein the the phase" with --wherein the phase--.  
Column 12, lines 18-19, replace "the narrow width pulse signal generator configured to generate a pulse" with --a pulse generator configured to generate the narrow width pulse signal--.

Signed and Sealed this  
Twenty-fourth Day of June, 2014

Michelle K. Lee  
*Deputy Director of the United States Patent and Trademark Office*